United States Patent
Howell et al.

(10) Patent No.: US 11,287,536 B1
(45) Date of Patent: Mar. 29, 2022

(54) RADIATION DETECTOR USING A GRAPHENE AMPLIFIER LAYER

(71) Applicant: National Technology & Engineering Solutions of Sandia, LLC, Albuquerque, NM (US)

(72) Inventors: Stephen W. Howell, Bloomington, IN (US); David W. Peters, Albuquerque, NM (US); Thomas Edwin Beechem, III, Albuquerque, NM (US); Isaac Ruiz, Albuquerque, NM (US); Richard Karl Harrison, Albuquerque, NM (US); Jeffrey B. Martin, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 422 days.

(21) Appl. No.: 16/162,756

(22) Filed: Oct. 17, 2018

Related U.S. Application Data

(60) Provisional application No. 62/576,718, filed on Oct. 25, 2017.

(51) Int. Cl.
   *G01T 1/17* (2006.01)
   *H01L 27/146* (2006.01)
   (Continued)

(52) U.S. Cl.
   CPC ............ *G01T 1/17* (2013.01); *G01T 1/185* (2013.01); *H01L 27/14659* (2013.01);
   (Continued)

(58) Field of Classification Search
   CPC ............ G01T 1/00; G01T 1/17; G01T 1/175; G01T 1/185; G01T 1/24; G01T 1/241–244; G01T 1/247; H01L 27/14; H01L 27/144; H01L 27/1446; H01L 27/146; H01L 27/14601; H01L 27/14603;
   (Continued)

(56) References Cited

U.S. PATENT DOCUMENTS

| | | | | |
|---|---|---|---|---|
| 9,293,627 | B1 * | 3/2016 | Beechem, III | ...... H01L 31/0232 |
| 2012/0161098 | A1 * | 6/2012 | Hiura | .................. C23C 16/0218 257/9 |

(Continued)

OTHER PUBLICATIONS

Foxe, et al. "Detection of Ionizing Radiation Using Graphene Field Effect Transistors", IEEE Nuclear Science Symposium conference record Dec. 2009. pp. 1-6. (Year: 2009).*

(Continued)

*Primary Examiner* — Anastasia Midkiff
(74) *Attorney, Agent, or Firm* — Martin I. Finston

(57) ABSTRACT

A radiation field is detected or imaged using one or more junction devices in which a two-dimensional conductor layer is capacitively coupled to a semiconductor absorber layer. In the junction devices, pixel-level amplification and read-out are accomplished through the photogating of the devices by absorption within the absorber layer while it is in a state of deep depletion. When the two-dimensional conductor is graphene, we refer to a device operating in that manner as a deeply depleted graphene-oxide-semiconductor ($D^2GOS$) detector.

15 Claims, 16 Drawing Sheets

(51) Int. Cl.
*H01L 31/028* (2006.01)
*G01T 1/185* (2006.01)
*H01L 31/119* (2006.01)
*H01L 29/16* (2006.01)

(52) U.S. Cl.
CPC .......... *H01L 31/028* (2013.01); *H01L 31/119* (2013.01); *H01L 29/1606* (2013.01)

(58) Field of Classification Search
CPC ......... H01L 27/14609; H01L 27/14612; H01L 27/14614; H01L 27/14616; H01L 27/1463; H01L 27/14643; H01L 27/14658; H01L 27/14659; H01L 29/02; H01L 29/12; H01L 29/16; H01L 29/1606; H01L 31/02; H01L 31/0248; H01L 31/0256; H01L 31/028; H01L 31/08; H01L 31/085; H01L 31/10; H01L 31/115; H01L 31/118; H01L 2924/102; H01L 2924/1025; H01L 2924/13088; H01L 2924/16793; H01L 2924/20202
See application file for complete search history.

(56) References Cited

U.S. PATENT DOCUMENTS

2014/0077161 A1* 3/2014 Duan ................. H01L 29/4958 257/29
2018/0054585 A1* 2/2018 Voutilainen ..... H01L 31/035218

OTHER PUBLICATIONS

Mikhelashvili, et al. "A Highly Sensitive Broadband Planar Metal-oxide-semiconductor Photodetector Fabricated on a Silicon-on-insulator Substrate", (Aug. 20, 2014) AIP Publishing, LLC, Journal of Applied Physics, 116, pp. 1-8 (Year: 2014).*

Cheng, et al., "Comprehensive Study on the Deep Depletion Capacitance-voltage Behavior for Metal-oxide-semiconductor Capacitor with Ultrathin Oxides", (Oct. 8, 2009), American Institute of Physics, Journal of Applied Physics, 106, pp. 1-8 (Year: 2009).*

Lin, Chu-Hsuan, et al., "Metal-Insulator-Semiconductor Photodetectors", (Sep. 28, 2010), MDPI, Sensors, Oct. 2010, pp. 8797-8826. (Year: 2010).*

Foxe, M. et al., "Graphene Field-Effect Transistors on Undoped Semiconductor Substrates for Radiation Detection," IEEE Transactions on Nanotechnology, 2012, vol. 11, pp. 581-587.

Geim, A. K. et al., "Van der Waals Heterostructures," Nature, 2013, vol. 499, pp. 419-425.

Harrison, R. et al., "Exploring Graphene Field Effect Transistor Devices to Improve Spectral Resolution of Semiconductor Radiation Detectors", 2013, SAND2013-10104.

Howell, S. et al., "Optical Detection Using Deeply Depleted Graphene-Oxide-Semiconductor Junction", 2017, SAND2017-12995C.

Howell, S. et al., "Graphene-Insulator-Semiconductor Junction for Hybrid Photodetection Modalities," Nature Scientific Report, 2017, vol. 7, 14651.

Kayyalha, M. et al., "Observation of reduced 1/f noise in graphene field effect transistors on boron nitride substrates," Applied Phycis Letters, 2015, vol. 107, 113101.

Kim, S. et al., "Realization of a high mobility dual-gated graphene field-effect transistor with Al2O3 dielectric," Applied Physics Letters, 2009, vol. 94, 062107.

Venugopal, A. et al., "Effective mobility of single-layer graphene transistors as a function of channel dimensions," Applied Physics, 2011, vol. 109, 104511.

Yan, H. et al., "Tunable infrared plasmonic devices using graphene/insulator stacks", Nature NanoTechnology, 2012, vol. 7, pp. 330-334.

* cited by examiner

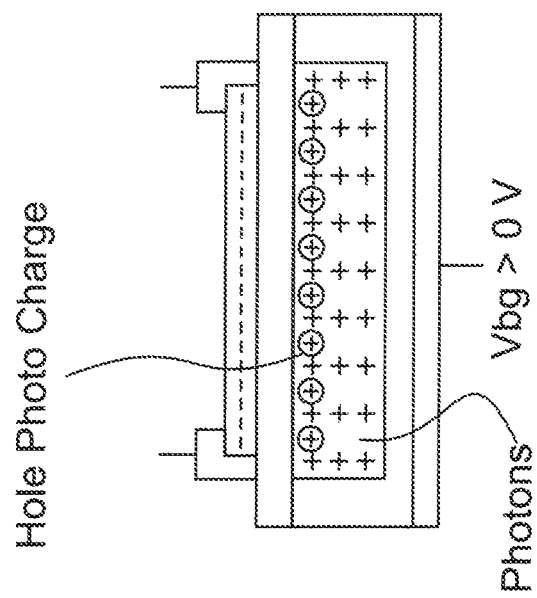
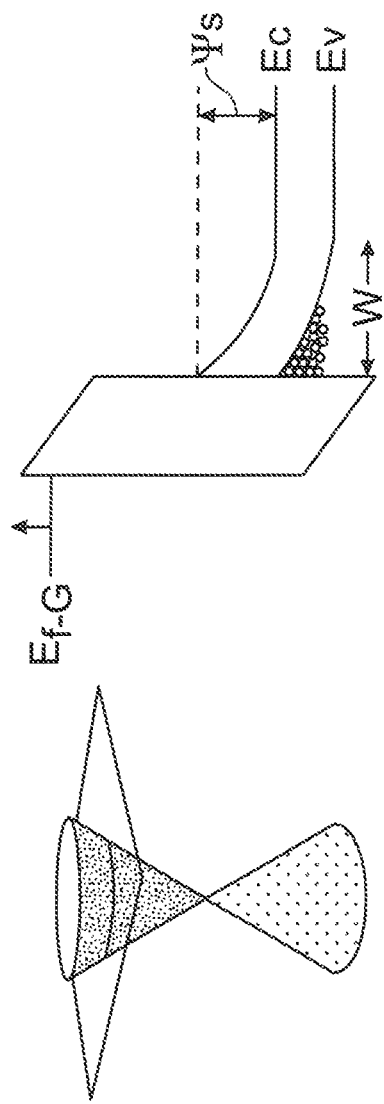
FIG. 3A
FIG. 3B
FIG. 3C

RADIATION DETECTOR USING A GRAPHENE AMPLIFIER LAYER

CROSS-REFERENCE TO RELATED APPLICATIONS

The present application claims priority to provisional application Ser. No. 62/576,718, filed on Oct. 25, 2017 and entitled "RADIATION DETECTOR USING A GRAPHENE AMPLIFIER LAYER," the entire disclosure of which is herein incorporated by reference in its entirety.

ACKNOWLEDGEMENT OF GOVERNMENT SUPPORT

This invention was made with Government support under Contract No. DE-AC04-94AL85000 between Sandia Corporation and the U.S. Department of Energy. This invention was made with Government support under Contract No. DE-NA0003525 awarded by the United States Department of Energy/National Nuclear Security Administration. The Government has certain rights in the invention.

FIELD OF THE INVENTION

The invention relates to semiconductor detectors for electromagnetic radiation and for energetic particles.

ART BACKGROUND

There is extensive current interest in the use of graphene layers for applications in photodetection because graphene offers both high carrier mobility and broadband photoconductive spectral response. It is implicitly difficult, however, to couple light into an atomically thin layer. For that reason, it has been difficult to achieve the sensitivities required for many practical applications.

One response to this challenge has been to enhance the optical absorption of graphene with coupled nanoantennas. In essence, resonant layers structured at the subwavelength level concentrate excitatory radiation into the active graphene channel. Even with these measures, however, absorption efficiency tends to be less than 50%. Further, typical recombination lengths in graphene are only on the order of 1 μm, which makes it challenging to harvest electron-hole pairs. These factors generally limit the sensitivity of nanoantenna-coupled graphene detectors to about 100 mA/W or less.

In an alternate approach, which we refer to as a "photogated" approach, the thin and essentially transparent graphene layer serves as a charge-sensing layer that detects charge generated within a thicker adjacent substrate either by optical absorption or by ionizing impact. That is, photogenerated charge created within the thick absorber is capacitively coupled to the graphene. This induces a charge of opposite polarity within the graphene channel, altering its conductance. Alterations in the channel conductance are sensed by measuring channel current during application of a bias voltage. Thus, the channel current mimics the behavior of a photocurrent.

The electric current in the graphene channel is proportional to product of carrier density times mobility. In graphene, the large ambipolar mobility (generally in the approximate range $10^3$-$10^5$ cm$^2$/Vs) provides a built-in photogain mechanism. For this reason, sensitivities achieved with photogated graphene devices are relatively high; values in excess 1,000 A/W have been reported.

Photogated graphene detectors are known. They have been reported using a variety of absorbers including quantum dots, pyroelectric materials, and semiconductors. Since the graphene in these devices is not relied upon for light absorption but only the sensing of charge, it is the absorber that determines the spectral response. As a consequence, this concept has potential applications for sensing any radiation over the range from ionizing radiation to the infrared.

The absorber properties also affect the detector speed, sensitivity, and dynamic range. Detector speed, for example, is determined not only by carrier velocity in the graphene channel, but also by the rate at which the channel is gated by photogenerated charge.

Similarly, the sensitivity of the detector depends not only on the transconductance of the graphene channel, but also on the balance between photogeneration and recombination within the absorber. Dynamic range is limited by amount of light collected by the absorber, and not by the graphene density of states (DOS).

In earlier work, we reported on a hybrid radiation detector in which a graphene field-effect transistor (GFET) was fabricated on top of a semiconductor absorber. This work was reported in Richard K. Harrison et al., "Exploring Graphene Field Effect Transistor Devices to Improve Spectral Resolution of Semiconductor Radiation Detectors," SAND2013-10104, Sandia National Laboratories (2013), hereinafter "Harrison 2013", the entirety of which is hereby incorporated herein by reference.

As reported in Harrison 2013, the absorber in our implementations was a semiconductor, namely silicon or silicon carbide. The GFET was electrically isolated from the absorber by a thin insulating layer serving as gate dielectric.

Our GFET device is structurally analogous to a metal-oxide-semiconductor (MOS) junction. When a voltage is applied to the semiconductor by way of a backside ohmic contact, a depletion region forms in a portion of the semiconductor beneath the graphene. Within the depletion region, the fixed space charge due to ionized donor or acceptor atoms creates an internal electric field; this field separates electron-hole pairs generated by an energetic event. Separated charge then collects at the insulator/semiconductor interface. Capacitive coupling of this interfacial charge layer alters a source-to-drain conduction channel within the graphene. Under application of, e.g., a constant source-to-drain voltage, shifts in the graphene conductivity can be measured as changes in source-drain current.

SUMMARY OF THE INVENTION

Further investigations, subsequent to the work reported in Harrison 2013, have revealed that still greater utility can be realized in our photogated device when the absorber is operated in deep depletion. Under that condition, the device can be operated with high sensitivity in a manner analogous to a charge coupled device (CCD), but with localized readout from the graphene.

Conventional CCDs are limited in performance by the need to transfer photogenerated charge from the location of generation to the location where it is read out. The shuttling of stored charge increases noise, it reduces speed and sensitivity, and it prohibits random access, so that pixels cannot be controlled independently. A new sensor element with the functionality of a CCD but offering the possibility to locally read out the photogenerated charge would present a path to expanded capability.

In our device architecture, pixel-level amplification and read-out are accomplished through the photogating of a graphene field-effect transistor (GFET) by absorption within a substrate while the substrate is in a state of deep depletion. We refer to a device operating in that manner as a deeply depleted graphene-oxide-semiconductor ($D^2GOS$) detector.

We believe that $D^2GOS$ detectors can exhibit responsivities as high as 2,500 A/W (25,000 S/W) for visible wavelengths, signal-to-noise ratios (SNRs) comparable to current commercial CCD systems, and dynamic ranges greater than 30 dB.

Because the gated channel in our design is moved out of the substrate (and into a capacitively coupled overlayer), the need is obviated to build circuit elements within the substrate. This opens up a very broad range of choices for the substrate material, which, in turn, implies that $D^2GOS$ detectors can offer a paradigm for imaging across the electromagnetic spectrum.

Accordingly, the invention in one aspect relates to a method for detecting or imaging a radiation field using one or more junction devices. Each junction device is a $D^2GOS$ detector as described above, in which a two-dimensional conductor layer is capacitively coupled to a semiconductor absorber layer. "Radiation" or "radiant energy" in this regard means electromagnetic radiation or high-energy radiation, i.e., x-rays, gamma rays, or energetic particles, such as alphas, betas, neutrons, recoil nuclei, or fission fragments.

According to our method, the one or more $D^2GOS$ detectors are driven into deep depletion by application of a back-gate voltage to back-gate electrodes on the semiconductor absorber. The $D^2GOS$ detectors are exposed to the radiation field that is to be detected. Source-drain voltages are applied between source and drain electrodes located at the ends of the graphene channel. A data readout is performed. The readout comprises reading out, from each of the $D^2GOS$ detectors, an indication of a drain current passing through its capacitively coupled two-dimensional charge-sensing channel layer.

In herein-disclosed embodiments, the charge sensing layer is graphene. Other 2D materials, such as molybdenum disulfide ($MoS_2$), could also be utilized in this device architecture in place of the graphene.

The invention in another aspect relates to an imaging system in which a plurality of junction devices as described above are arranged in an array. The system also includes a controller, a control bus, and a readout bus connected between the junction devices and the controller.

Within each junction device, the source and drain electrodes are connected to the channel layer so that when they are energized by an applied source-drain voltage, a source-drain current passes between them through the channel layer. The controller is configured to provide source-drain voltages for the junction devices. The controller is also configured to provide back-gate voltages to be applied to the back-gate electrodes of the junction devices, specifically, back-gate voltages sufficient to drive the interface regions of the respective junction devices into deep depletion.

The control bus is connected so as to deliver the source-drain voltages and back-gate voltages from the controller to the junction devices. The readout bus is connected so as to deliver readout signals, comprising signals indicating source-drain current, from the junction devices to the controller.

The controller is further configured to receive the readout signals and to sample the signal indicating source-drain current from each junction device while its interface region is in deep depletion.

In embodiments, the channel layer of each junction device comprises graphene and the dielectric layer of each junction device is an insulating oxide layer, whereby a graphene/oxide/semiconductor (GOS) junction is formed in the interface region of each junction device.

In embodiments, the controller is configured to drive all GOS junctions of the array of junction devices into deep depletion simultaneously.

In embodiments, the controller is configured to operate in a random-access mode, in which it can provide the source-drain voltages to individually selectable ones of the junction devices and to sample the readout signals indicating source-drain current from individually selectable ones of the junction devices.

In embodiments, the array of junction devices includes multi-device pixels. Each multi-device pixel comprises a group of coplanar junction devices having different wavelength ranges of spectral sensitivity.

In other embodiments, the array includes vertical stacks of junction devices having different spectral ranges.

In embodiments, at least some of the junction devices are vertically stacked with ionization detectors such as semiconductor ionization detectors.

BRIEF DESCRIPTION OF THE DRAWINGS

FIGS. 3A-3C illustrate the changes relative to FIGS. 2A-2C when the GOS junction is placed under photoexcitation.

FIG. 12 is a notional cross-sectional view of a stacked pixel having layers with different spectral sensitivities. FIG. 13 is a notional perspective view of a stacked multimodal array in which each layer has a different spectral sensitivity.

DETAILED DESCRIPTION

Introduction

The operation of a conventional CCD is best understood with reference to the basic underlying device, the metal-oxide-semiconductor (MOS) capacitor. When the semiconductor is biased to deep depletion, the built-in field of the space charge region separates electron-hole pairs (e-h) with near perfect efficiency; this allows for a time-dependent buildup of charge at the oxide-semiconductor interface. The photoresponse is then obtained by reading out the collected charge after it has been transported to a readout line by a process of shift transfer.

As noted above, CCD capability is limited because the readout of charge is nonlocal. That is, inefficiencies in both line and frame transfer schemes result in charge loss and image smear so that sensitivity and spatial resolution are reduced. Further, the operating frequency is typically limited to less than 20 GHz, even in the highest-speed cameras currently available on the market. Dark charge that accumulates in the shift-transfer process distorts the signal charge packets. Due to the shift-transfer process, the individual pixels are inseparably coupled, so that random access to pixels is prohibited. Thus, for example, pixel-specific integration times cannot be specified.

With the introduction of localized charge sensing, these limitations can be overcome. Our combination of photogating the graphene channel with sampling of its conductivity provides a mechanism for this localized charge-sensing readout. By also operating the absorber in a state of deep depletion, we make the maximum use of the photogating phenomenon. Simply stated, the resulting device can integrate signal like a CCD, but it can also be read out like a photodiode.

Since our detector mimics a charge-integrating photodiode, it is compatible with CMOS imaging paradigms, and massed in an array, it could enable imaging in a manner similar to a CCD camera. Still further, the pixels of such an array could be structurally isolated and independently controlled (e.g., with different integrations times), and they could utilize several different absorbing materials so as to provide multimodal detection.

Moreover, our approach invites the use of non-traditional semiconductors such as indium arsenide (InAs), indium antimonide (InSb), and mercury cadmium telluride (HgCdTe, also referred to as MCT). These materials are ordinarily difficult to implement using the standard CCD methodology, but our use of a graphene layer obviates the need for long-rang charge transport, and the graphene can be integrated on a broad selection of possible substrates.

D²GOS Device Architecture and Characterization

Figure 1A:
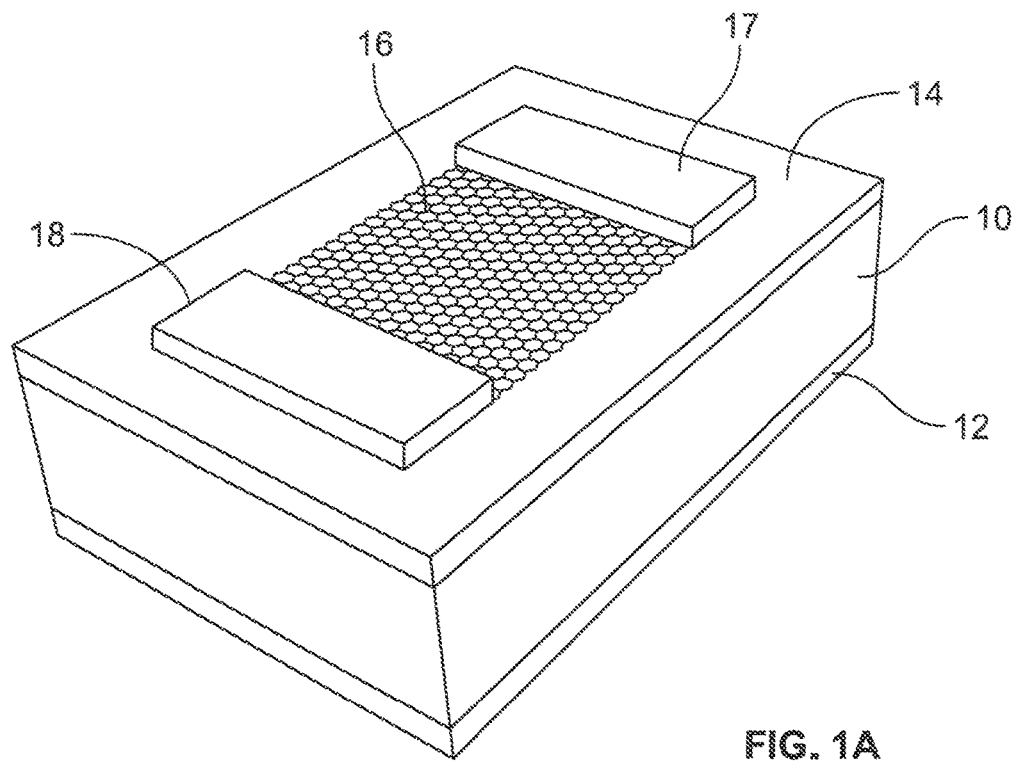
FIG. 1A is a notional perspective view of a $D^2GOS$ device according to principles described here.

FIG. 1A illustrates a pixel according to the D²GOS detector concept. Like a MOS capacitor, the device is structured as a back-gated graphene-oxide-semiconductor (GOS) junction. As seen in the figure, absorber 10 is backed by back-gate electrode 12 and is overlain by oxide layer 14. The graphene channel 16 is seen overlying the oxide layer. Source electrode 17 and drain electrode 18 overlie the graphite channel.

Figure 1B:
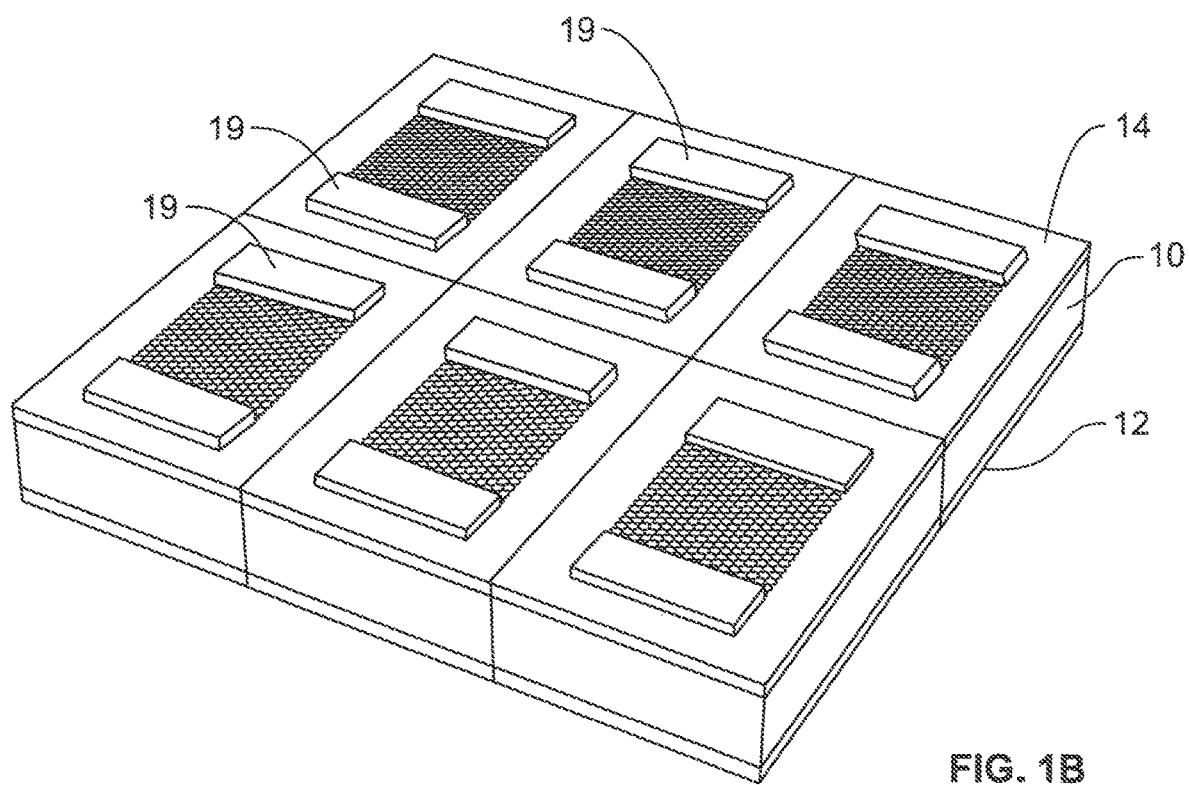
FIG. 1B is a notional perspective view of an array of devices such as the device of FIG. 1A.

Pixels of, e.g., the kind illustrated in FIG. 1A can be arranged in arrays for use in imaging devices and the like. An example of such an array is shown notionally in FIG. 1B. As seen in the figure, each pixel 19 corresponds to one instantiation of the device of FIG. 1A.

Graphene channel conductance is measured using the source and drain electrodes. To sense photogenerated charge, the semiconductor absorber is brought into deep depletion by rapid application of a back-gate voltage ($V_{bg}$). In the discussion below, we will adopt the convention that the back-gate voltage is specified relative to the source, which may for convenience be considered to be at ground potential.

The nature of the state of deep depletion is best understood by first considering the state of depletion in a MOS capacitor model in which the graphene is the gate metal and the absorber is the semiconductor. The graphene is assumed to be close to ground potential, and a voltage is applied to the back-gate electrode. In other words, the gate bias has opposite polarity from the back-gate voltage.

Ideally (although not necessarily in practice), the semiconductor is entirely charge-neutral when the gate bias equals the difference in work function between the gate metal and the semiconductor. This condition is referred to as the Hatband condition. We now change the gate bias in the direction that drives majority carriers away from the gate. In an n-type absorber, for example, this would entail making the gate voltage more negative, or equivalently, making the back-gate voltage more positive.

Driving majority carriers away from the gate causes a space charge to build up near the gate due to the fixed charges on the ionized donor or acceptor atoms. For example, a positive space charge would build up in the n-type absorber because electrons would be driven away. This condition is referred to as depletion because the majority carriers are depleted from the neighborhood of the gate.

The depletion region extends into the semiconductor to a depth W referred to as the depletion width. In thermal equilibrium, the depletion width W is determined by the gate bias and the impurity concentration in the semiconductor.

The growth of the depletion region is counteracted by the formation of an inversion layer next to the gate dielectric. The inversion layer is formed by thermally generated minority carriers. As a consequence, the depletion width under steady-state conditions has an upper bound $W_{max}$ that is dependent on the temperature, the impurity concentration in the semiconductor, and the intrinsic carrier concentration.

Deep depletion, by contrast, is a dynamic, non-equilibrium condition. To produce deep depletion, the gate bias is ramped in the direction toward increasing inversion. The gate voltage is swept so quickly that the semiconductor does not have enough time to come to equilibrium. In that case, the thermal generation of minority carriers is not fast enough to fully form an inversion layer, and the depletion layer grows beyond its equilibrium maximum depth $W_{max}$.

Figure 2A:
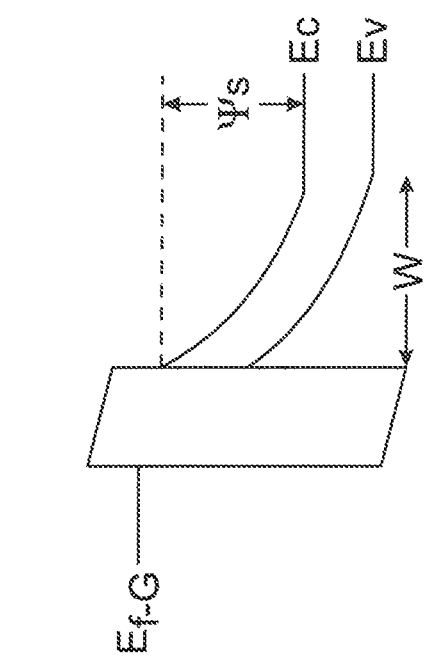
FIG. 2A is a simplified energy-band diagram of a graphene-oxide-semiconductor (GOS) junction, presented for pedagogical purposes. The band diagram is for the condition when the GOS junction is brought into deep depletion by a momentary voltage pulse applied to the back gate.

FIG. 2A shows the energy band diagram of the GOS junction, assuming a lightly doped n-type silicon absorber that is initially biased at a back-gate voltage $V_{bg}$ greater than 0V. The graphene Fermi level $E_{f-G}$ is marked on the figure, as well as the energy $E_C$ at the bottom of the silicon conduction band and the energy $E_V$ at the top of the silicon valence band. The band diagram is for the condition when the GOS is brought into deep depletion by a momentary voltage pulse applied to the back gate.

Figure 2B:
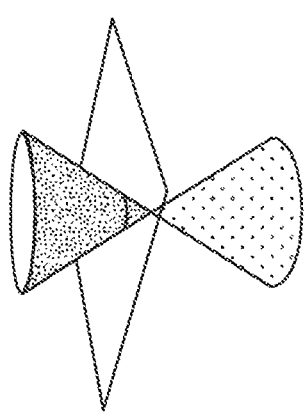
FIG. 2B is an idealized three-dimensional band diagram for the graphene, with a plane indicating the Fermi level $E_{f\text{-}G}$.
Figure 2C:
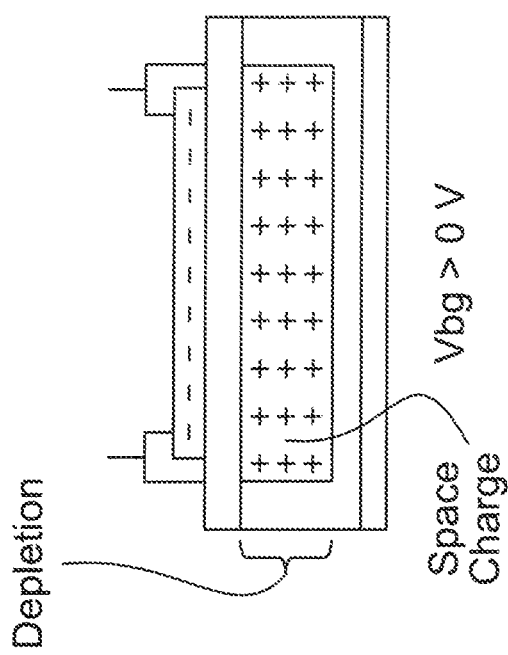
FIG. 2C is a cross section of the GOS junction, showing a view of the depletion region in which the fixed space charge is symbolically represented.

FIG. 2B is an idealized three-dimensional band diagram for the graphene, with a plane indicating the Fermi level $E_{f-G}$. FIG. 2C is a cross section of the GOS junction, showing a view of the depletion region in which the fixed space charge is symbolically represented.

As in a MOS junction, positive $V_{bg}$ forces mobile electrons to diffuse into the bulk silicon, exposing the positive space charge within the depletion zone (indicated in FIG. 2A by the depletion depth W). The surface potential (vs) at the silicon/oxide (Si/ox) interface goes negative. Under photo-excitation, the electric field within the depletion region separates photo-generated electron-hole pairs, resulting in the collection of holes at the Si/ox interface.

FIGS. 3A-3C illustrate the changes relative to the three preceding figures when the GOS junction is placed under photoexcitation. Under photoexcitation, the electric field within the depletion region separates photo-generated electron-hole pairs. As indicated in the figures, a population of photogenerated holes (i.e., of minority carriers) collects at the Si/ox interface. Dark charge also accumulates at the interface.

Because the graphene channel is capacitively coupled to the underlying silicon absorber, the holes collected at the Si/ox interface induce a counterbalancing population of electrons in the graphene channel, as also indicated in the figure. The change in the electron population modifies the graphene Fermi level, resulting in a change in the conductivity of the graphene film.

Conductivity changes in the graphene are readily detected by applying a small voltage, i.e., a voltage much smaller than the back-gate voltage, across the graphene channel between the source and drain electrodes and measuring changes in the source-drain current.

As time increases under continuous illumination, the hole density at the Si/ox interface increases, causing the magnitude of the surface potential to decrease, and causing the depletion width to shrink as holes collect in the potential well. This behavior mimics a classical CCD pixel with the exception of the top-gate electrode being replaced with a graphene channel that locally senses charge at the Si/ox interface.

Illustrative Embodiment

We fabricated $D^2GOS$ detector arrays by transferring chemical vapor deposition (CVD) derived graphene onto a lightly doped n-type silicon absorber ($N_d \sim 10^{14}$ cm$^{-3}$) capped with 50 nm of atomic layer deposited (ALD) hafnium dioxide, $HfO_2$. The graphene was n-type with an estimated residual carrier concentration of $1.3 \times 10^{12}$ cm$^{-2}$. The hafnium dioxide had a measured dielectric constant of 18. Each of several arrays contained twenty-five $D^2GOS$ detector elements, each measuring 200×200 μm. More detail about our fabrication methods is provided below.

Figure 4:
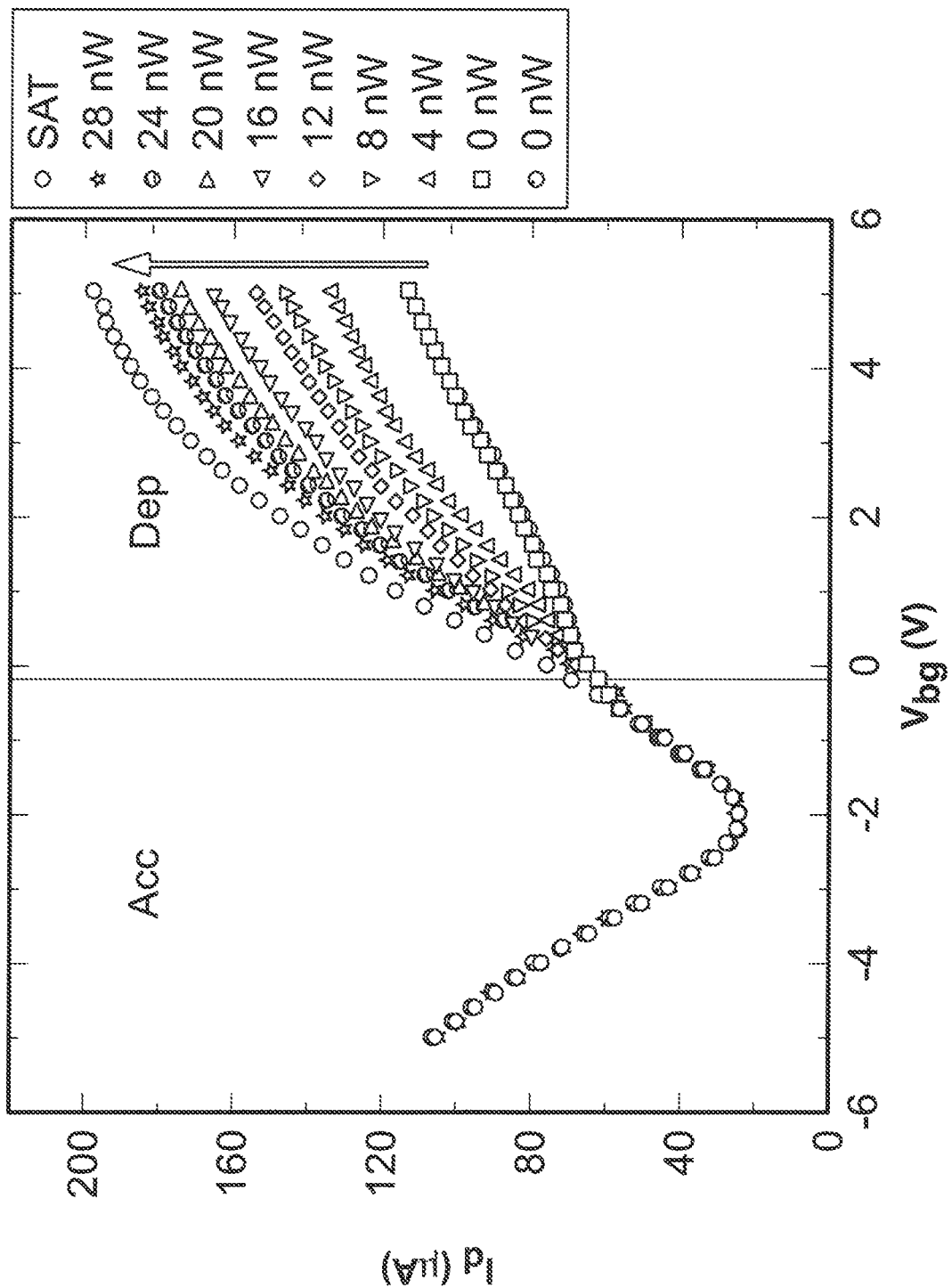
FIG. 4 is a graph of drain current ($I_d$) measured as a function of back-gate voltage ($V_{bg}$) for an example $D^2GOS$ device under dark conditions and under illumination.

FIG. 4 is a graph of drain current ($I_d$) measured as a function of back-gate voltage ($V_{bg}$) for a single $D^2GOS$ detector under dark conditions and under illumination at a wavelength of 635 nm. The drain bias was 100 mV.

The dark response (0 nW optical power) is shown as the superimposed traces from two experimental measurements. For illuminated conditions, a respective trace is shown for seven optical power levels ranging in increments of 4 nW from 4 nW to 28 nW. The uppermost trace represents the response of the pixel under saturation illumination. The arrow in the figure indicates the direction of increasing optical power.

The vertical line in the figure divides the plot into accumulation (Acc) and depletion (Dep) regions. For these data, point-to-point integration time was estimated to be ~20-25 ms.

We determined that deep depletion could be achieved by sweeping the gate voltage at a rate greater than 0.5V/s. To assure deep depletion of the silicon substrate, we swept the gate voltage at a rate of 10V/s or more in steps of 0.2V. For these data, the point-to-point integration time was roughly 20-25 ms.

We detected charge neutrality at a back-gate voltage of about −2V, where a minimum in the drain current is seen in the figure.

With further reference to the figure, it is seen that under illumination, the drain current begins to rise with increasing optical power at a back-gate voltage of −0.2V. Without wishing to be bound by any particular mechanism, we currently believe that −0.2V is in the neighborhood of the flatband voltage, which marks the boundary between the accumulation and depletion regimes.

In accumulation ($V_{bg} < -0.2$ V), mobile electrons in the n-type silicon collect at the Si/ox interface. The junction behaves like a parallel plate capacitor, where electron charge present at the Si/ox interface depends on $V_{bg}$. This charge is approximated by $Q_{Si} = C_{ox}(V_{bg} - V_{fb})$ where $C_{ox}$ is the oxide capacitance and $Q_{Si}$ is the areal charge density at the Si/ox interface. The voltage-induced electron density at the Si/ox interface, in turn, is balanced by an equivalent hole density within the graphene channel. The increased hole density alters the conductance of the graphene channel. Under these conditions, the amount of photogenerated charge is dwarfed by the charge accumulating from the gate. In accumulation, recombination rates in the silicon increase with the carrier density as well. As a result, no substantial photoresponse is exhibited when the device operates in accumulation.

In depletion ($V_{bg} > -0.2$ V), mobile electrons are swept away from the Si/ox interface and into the bulk silicon, leaving behind a space-charge region. The electric field associated with the space charge separates photogenerated electron-hole pairs with near perfect efficiency. Holes therefore collect at Si/ox interface when the device is illuminated. Electrons are induced within the graphene channel to balance this charge, thereby causing an increase in current proportional to the product of the induced charge and the graphene mobility. This change in current is the measured photoresponse.

It is important to note that the $D^2GOS$ detector integrates the photoresponse over time and produces a photogenerated signal that increases with the extent of the space-charge region.

Figure 5:
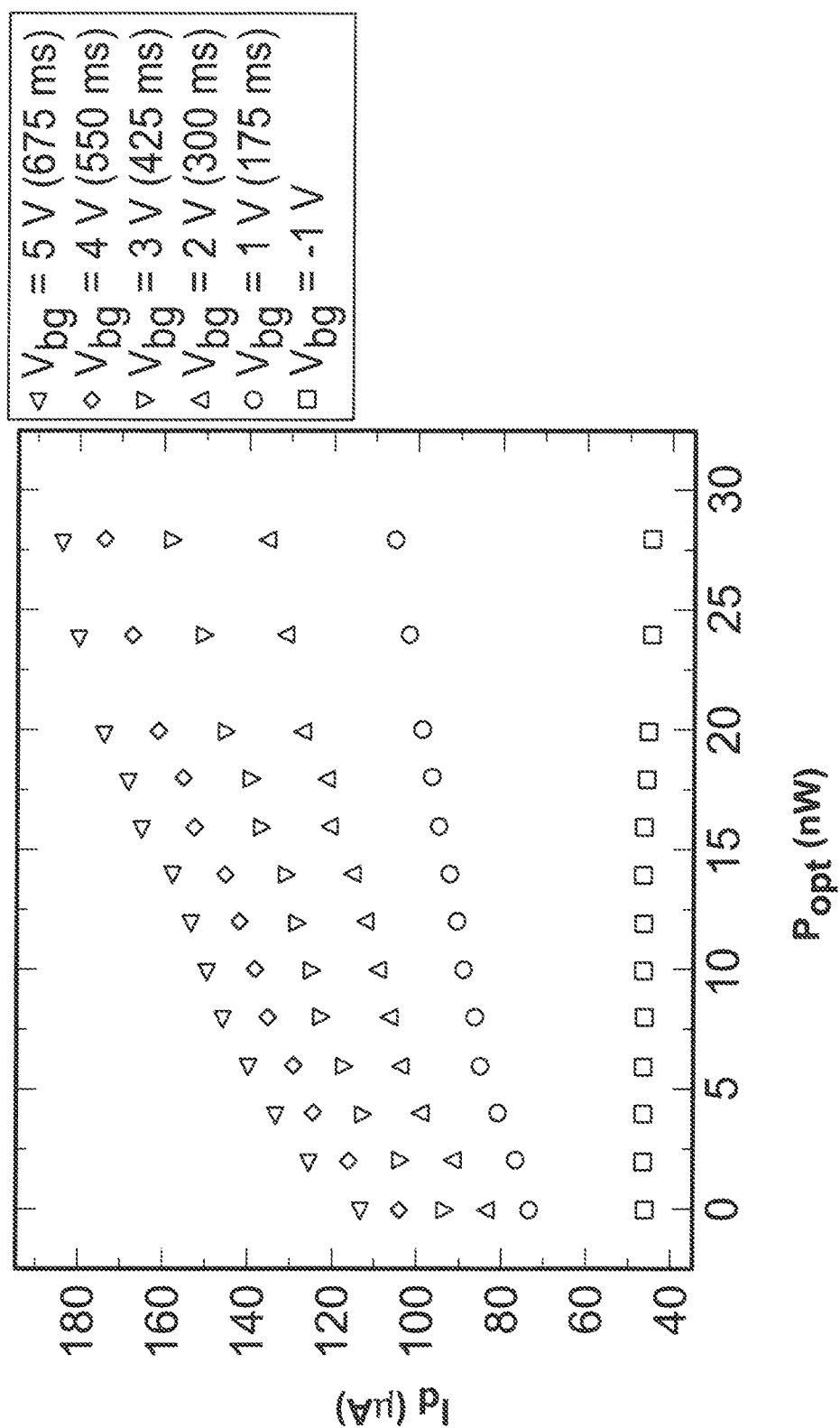
FIG. 5 is a graph of drain current as a function of optical power incident on an example $D^2GOS$ device. A separate trace is provided for each of six values of the back-gate voltage.

In FIG. 5, the drain current is plotted as a function of optical power. A separate trace is provided for each of six values of the back-gate voltage, ranging from −1V to 5V in increments of 1 V (except for the omission of a 0V trace).

Also indicated in FIG. 5 is the integration time, i.e., the time that the substrate has been depleted. As seen, the integration time increases in steps of 125 ms from a value of 175 ms at $V_{bg}=1V$ to a value of 675 ms at $V_{bg}=5V$. The reason for this variation is that we used the same gate-voltage sweep rate for all of the traces. At a constant gate-voltage sweep rate, it takes increasing amounts of time for the voltage applied to the back gate to go from the flatband voltage to each of the successively greater end values of $V_{bg}$ represented in the figure.

It will be seen that qualitatively speaking, making the gate voltage more positive will induce higher currents in the graphene and larger responses to light. With larger $V_{bg}$, the potential well at the interface and the depletion depth will both deepen, thus increasing the well's storage capacity. More light will consequently be absorbed and collected within the depletion region before saturation.

Because $V_{bg}$ is swept, i.e., ramped up, larger gate voltages imply longer integration times, hence more hole collection. Increased hole collection results in larger electron density within the graphene, which in turn leads to greater conductance.

Figure 6:
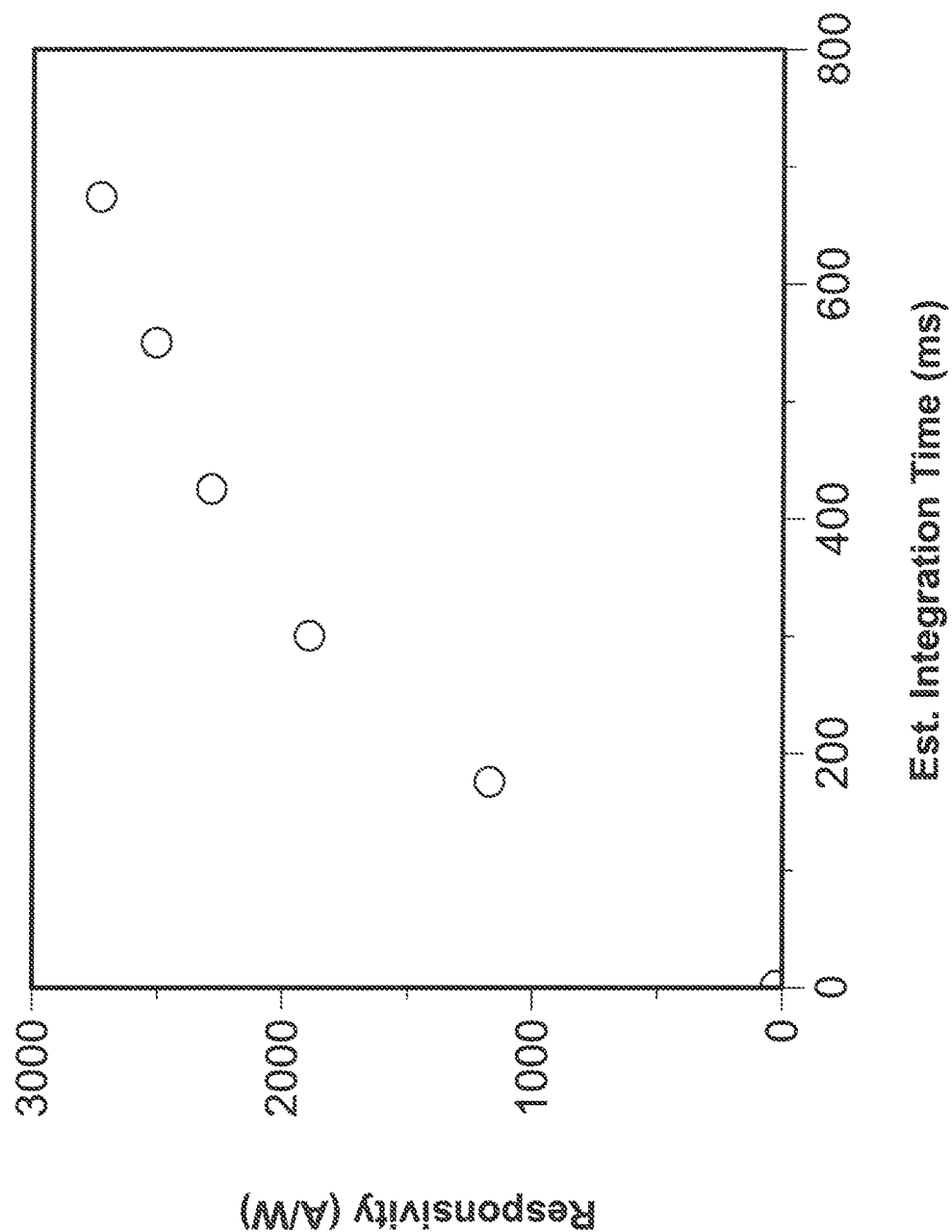
FIGS. 6 and 7 are graphs of the responsivity of an example $D^2GOS$ device as a function of the estimated drain current integration time.
Figure 7:
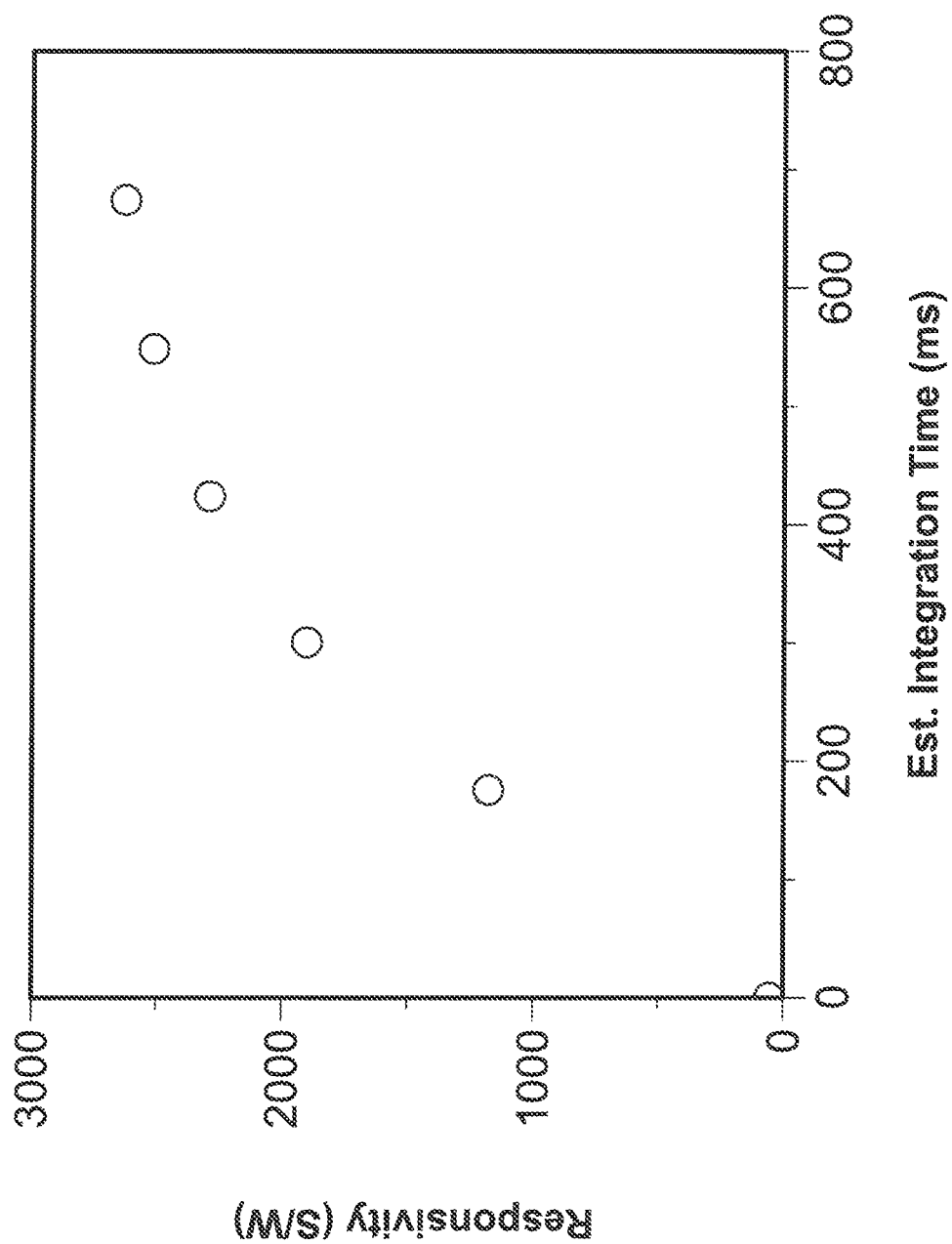

In quantitative terms, the responsivity of the device increases with gate voltage. By extension, it also increases with the integration time and with the size of the space-charge region. This is seen in FIGS. 6 and 7, where the responsivity is plotted as a function of the estimated integration time. The responsivity is plotted in amperes per watt in FIG. 6 and in Siemens per watt in FIG. 7.

The plotted data were extracted from linear fits of the data of FIG. 5. The drain voltage was set 100 mV, the source voltage was set to ground, and the back-gate voltage was referenced to ground. As seen in the figures, the responsivity reached values in excess of 2,500 A/W.

It should be noted in this regard that the changes in source-drain current reported by the sensor are indicative of time-integrated photogenerated charge. Consequently, performance metrics such as responsivity, signal-to-noise ratio, and dynamic range are time-dependent and also dependent on the source-drain bias.

Figure 8:
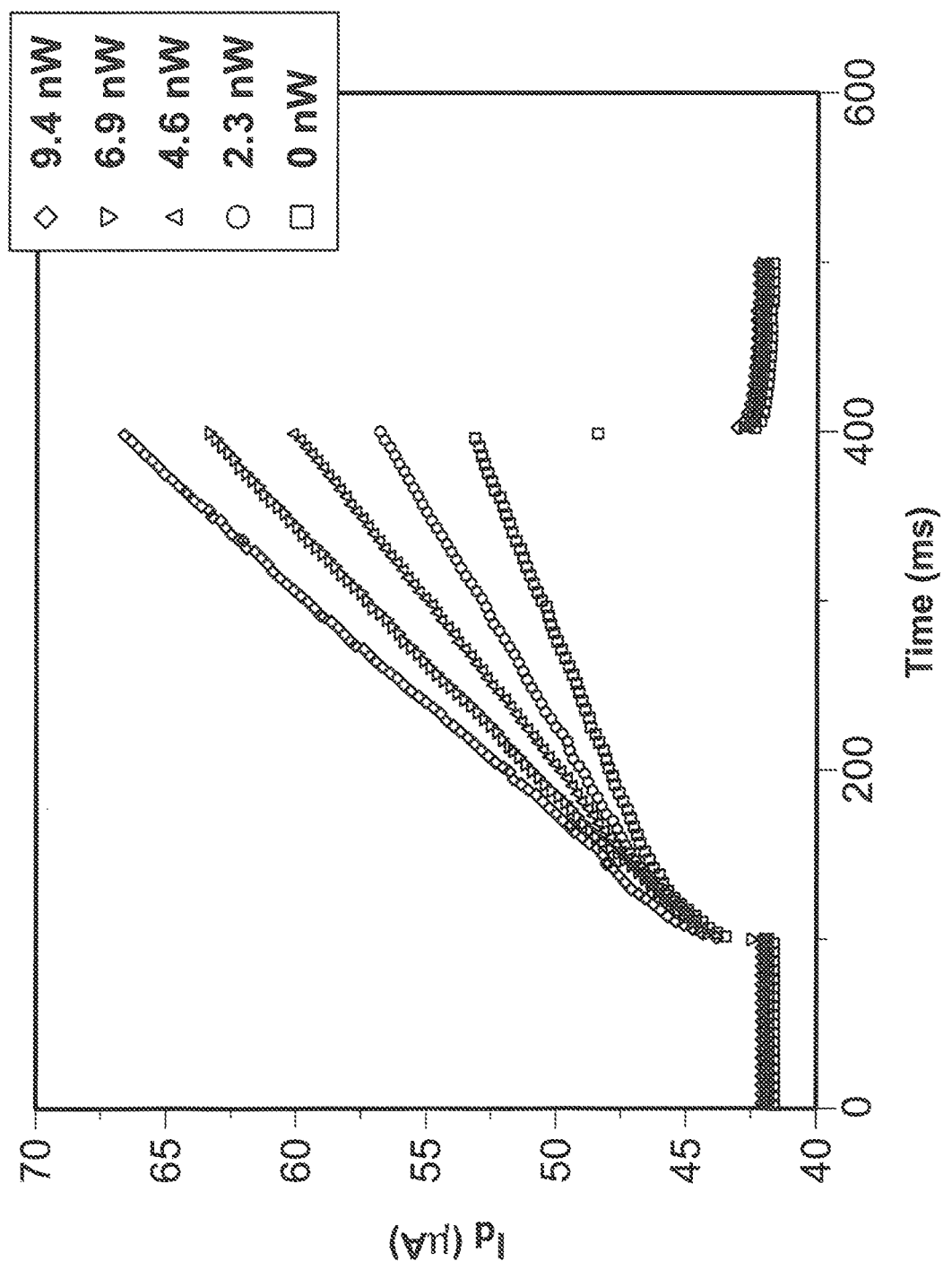
FIG. 8 is a graph of the measured photoresponse, versus time, of a $D^2GOS$ device that is rapidly biased into deep depletion by a gate pulse. Five traces are shown, each corresponding to a respective optical power from zero to 6.9 nW.

FIG. 8 is a graph of the measured photoresponse of a D²GOS detector that is rapidly biased into deep depletion using a gate pulse of +3 V applied for 300 ms at t=100 ms. The source-drain bias was 100 mV. The measurements were taken with a point-to-point sample time of 3 ms. Five traces are shown, each corresponding to a respective optical power. The optical power was varied in steps of 2.3 nW from 0 (dark condition) to 6.9 nW, and a final trace is provided at 9.4 nW of optical power.

With reference to FIG. 8, it will be seen that as charge collects during deep depletion, the graphene's conductivity increases linearly with the increasing electron charge density created by the capacitively coupled hole charge within the potential well.

Figure 9:
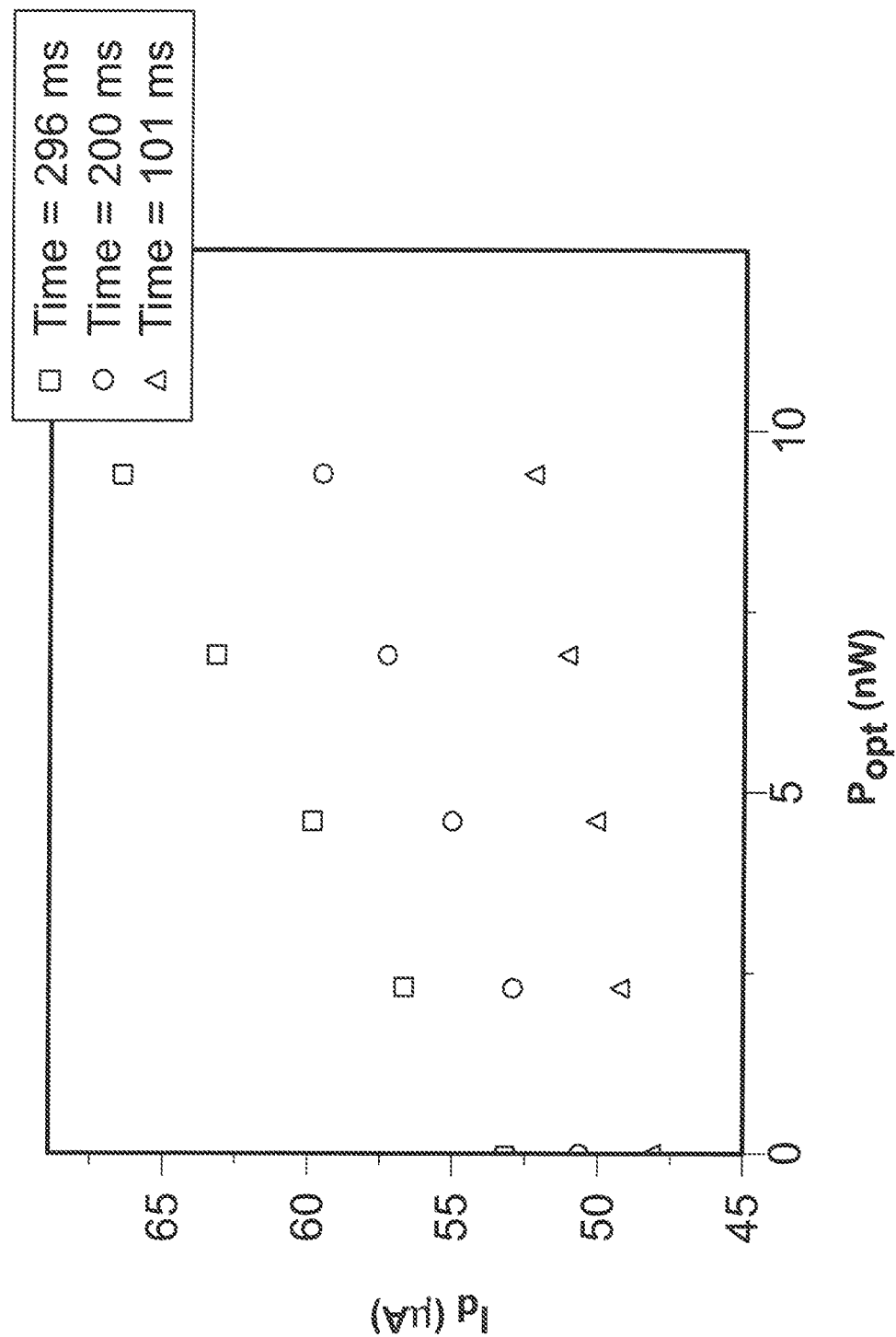
FIG. 9 is a graph of drain current as a function of optical power for the $D^2GOS$ device of FIG. 8. Three separate integration times are represented in the figure.

A further understanding will be gained from FIG. 9, which is based on the same data as FIG. 8. In FIG. 9, the drain current is plotted as a function of optical power for three separate integration times, namely 101 ms, 200 ms, and 296 ms. The drain current is seen to increase linearly with incident power. The responsivity does likewise.

We found very little hysteresis in consecutively collected acquisition loops. We conclude from this that charge is being integrated at the interface, and is not being dictated by traps within the $HfO_2$ dielectric.

Reference to FIG. 5 and FIG. 9 shows that current is transported through the device even when it remains in the dark; that is, there is a non-zero drain current even at zero optical power. We attribute this dark current to holes generated by thermal and surface-generation processes that collect in the potential well at the Si/ox interface. Such dark charge reduces the performance of the detector by adding noise and by filling the well, with the consequence of reduced dynamic range.

We estimated the signal-to-noise ratio (SNR) from the equation:

$$SNR = S\,dt[S\,dt + D\,dt + (N_{Readout})^2]^{-1/2},$$

where S is photo-generated signal per unit time, D is the dark charge signal per unit time, and $N_{Readout}$ is the signal readout noise. To estimate SNR, data for the dark current $I_{d\text{-}Dark}(t)$ and data for the current $I_{d\text{-}Light}(t)$ under lighted conditions are used. For our estimates, $$S\,dt = I_{d\text{-}Light}(t) - I_{d\text{-}Dark}(t) \text{ and } D\,dt = I_{d\text{-}Dark}(t) - I_d(0),$$

where $I_d(0)$ is the offset drain current prior to application of the Vbg pulse.

Readout noise $(N_{Readout}^2)$ derives primarily from thermal, shot, and 1/f (flicker) sources. These were quantified by taking the Fourier transform of the drain current measured in the dark over a 10 s period subject to a sampling rate of 333 Hz. This gave us a normalized spectral noise density $(S_I/I^2)$ spanning from $10^{-6}$ Hz at low frequency to $10^{-9}$ at frequencies above 30 Hz. Readout noise was found to have a magnitude on the order of 50 nA, which is inconsequential relative to the noise arising from dark processes.

Figure 10:
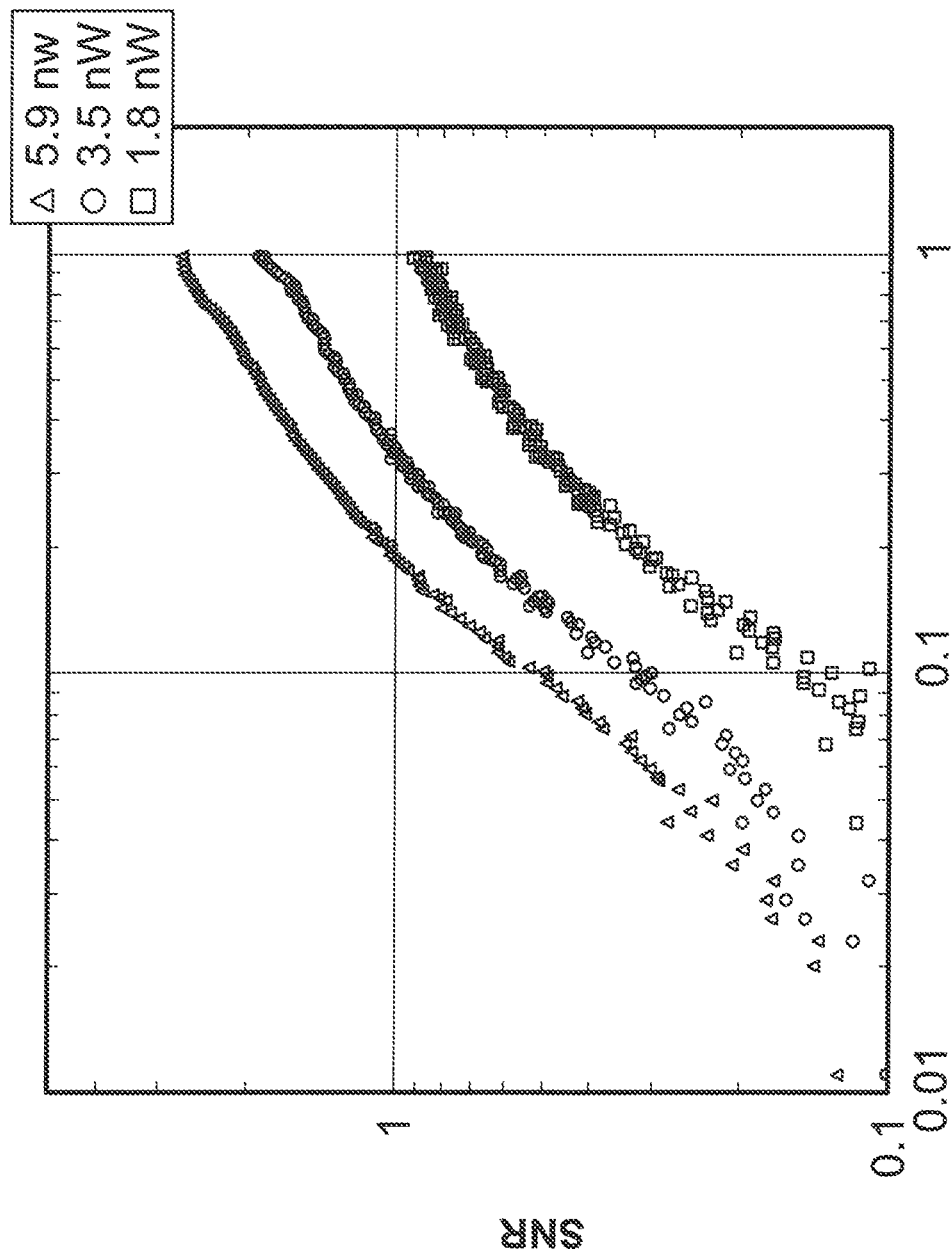
FIG. 10 is a graph of signal-to-noise ratio as a function of integration time for an example $D^2GOS$ device. Three different illumination powers are represented in the figure.

FIG. 10 presents the room-temperature SNR as a function of integration time for three illumination powers: 1.8 nW (bottom curve), 3.5 nW (middle curve), and 5.9 nW (top curve). As seen in the figure, an SNR near 3 was achieved using modest integration times and relatively low illumination levels. Improvement is expected with cooling.

The dynamic range is determined by the charge-storage capacity of the potential well, the amount of time-dependent dark charge filling it, and the readout noise level. Well capacity was measured by monitoring the source-drain current in the dark after a gate pulse of 3V was applied. Saturation times of 8-9 seconds were observed at room temperature. This correlates to a well capacity $\phi_{tot}$ of 0.8 $\mu C/cm^{-2}$.

The dynamic range DR of the D²GOS junction can be calculated from the equation:

$$DR = 20\,\log_{10}\{[I_{d,Sat} - I_d(0)]/[I_{d,Dark}(t) - I_d(0) + I_{Noise}]\}$$

where $I_{d,sat}$ is the drain current of a saturated well, $I_d(0)$ is the drain current just prior to application of the back-gate voltage (t=0), $I_{d,Dark}(t)$ is the time-dependent drain current under dark illumination, and $I_{noise}$ is the graphene noise current at the sampling time of 3 ms.

Figure 11:
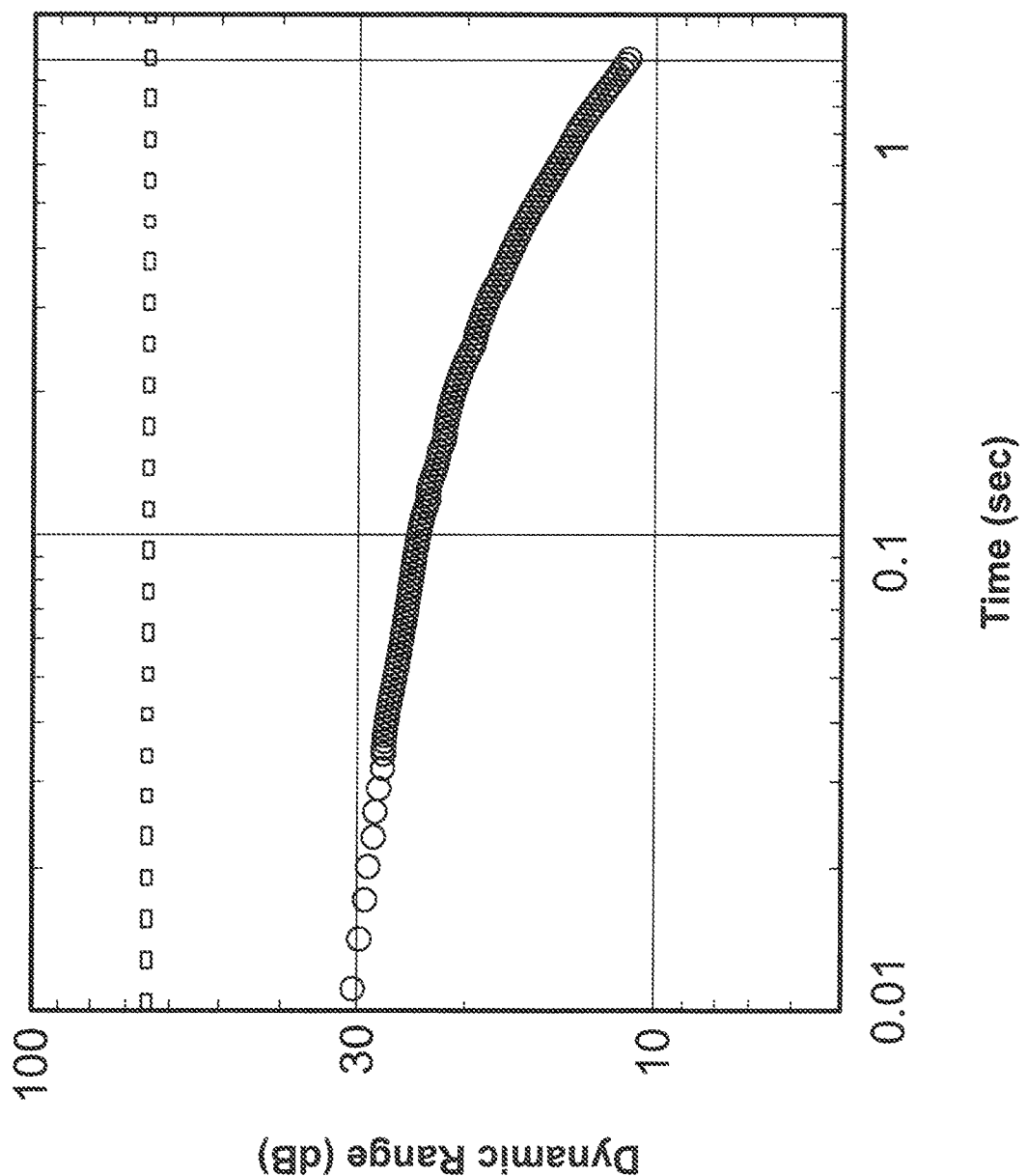
FIG. 11 is a graph of dynamic range (in decibels) as a function of the integration time for an example $D^2GOS$ detector.

FIG. 11 is a graph of dynamic range (in decibels) as a function of the integration time for an example D²GOS detector. As seen in the figure, the D²GOS detector exhibited a room-temperature dynamic range of 10-30 dB depending on the integration time. Cooling is expected to raise the dynamic range to as much as 60 dB, as indicated by the horizontal dotted line in the figure.

Fabrication Details

Devices were fabricated on 400 μm thick, n-type, low phosphorous doped <111> silicon wafers possessing a resistivity greater than 5000 Ω-cm. The backside of the wafer was implanted with 75-As+ ions with an implant energy of 40 keV and an implant dose of $3\times10^{15}$ ions/cm² to form the back-side ohmic contact. The implant was then activated by rapid thermal annealing (RTA) at 900° C. for 30 seconds in a nitrogen atmosphere.

Secondary ion mass spectroscopy (SIMS) revealed that the arsenic (As) implant was present at depths between 500-750 nm from the backside. The backside was then ion milled to remove any native oxide and a 20 nm/200 nm Ti/Au film was e-beam evaporated for the metal contact.

The wafer was rinsed in 1:4 BOE to remove any protective and native oxide, and then about 50 nm of $HfO_2$ was deposited by atomic layer deposition (ALD) at 250° C. (TDMAH and $H_2O$ sources) onto the front side of the wafer for use as the gate dielectric.

Graphene (single layer, 1 cm×1 cm, Trivial Transfer Graphene from ACS Material®) was then transferred onto the substrate, rinsed in acetone and isopropanol, and then blown dry with nitrogen gas. The graphene pixels were then patterned by photolithography and etched by a 600-W oxygen plasma in an asher for several minutes.

Subsequently, 20 nm/200 nm Ti/Au etch stops were put down on the left and right side edges of the graphene pixel using e-beam evaporation, and a passivation dielectric was deposited over the entire substrate.

To ensure good adhesion of the dielectric onto the graphene, 1.5 nm of Al was deposited by e-beam evaporation and then oxidized, followed by a 50 nm film of $HfO_2$ deposited by ALD.

The etch stops were opened up in a 65-second chlorine etch through the $HfO_2$. Then the final Ti/Au source and drain contacts were patterned and deposited using e-beam evaporation.

Design Considerations

As explained above with reference to FIG. 1A, the basic structure of an example detector or detector pixel includes a semiconductor absorber, overlain by an oxide gate dielectric, overlain by the graphite channel. When the semiconductor absorber is composed of silicon, the use of a silicon dioxide gate dielectric is especially favorable because thermal growth of the oxide leads to a high-quality interface with the underlying silicon. As a consequence, interfacial trapping effects can be minimized, leading to better detector performance.

The gate dielectric does not, however, need to be composed of a single material or of an in situ grown material. It can be deposited, or even applied using transfer techniques. In the example provided above, the gate dielectric was composed of hafnium dioxide. Hafnium dioxide is advantageous because it forms an interface of good quality, and because it has a very high dielectric constant, about five times the dielectric constant of silicon. The high dielectric constant reduces the back-gate voltage required to reach a state of deep depletion in the silicon.

To achieve the dual benefits of very high interfacial quality and high effective dielectric constant in the gate dielectric, we believe it could be advantageous to fabricate the gate dielectric as a double layer. The bottom layer would be thermally grown silicon dioxide, and the top layer would be hafnium dioxide.

Because there is flexibility in the composition of the gate dielectric and the manner of applying it to the absorber surface, there is also flexibility in the choice of absorber. In particular, the opportunity is offered to employ high-atomic-number semiconductors for the purpose of detecting high-energy radiation, i.e., x-rays, gamma rays, and energetic particles. Examples of high-atomic-number semiconductors that may be useful in this regard include thallium bromide, cadmium telluride, cadmium zinc telluride, lead iodide, mercuric iodide, and oxides of uranium and thorium.

The range of choices of absorber material is broadened still further because although the absorber needs to have relatively high mobility for the minority carriers, the same is not true for the majority carriers. This permits the selection of semiconductors that would be disfavored in conventional semiconductor detectors, which generally require the carriers of both polarities to have high mobility.

In particular, the range of choices for absorber materials includes wide bandwidth semiconductors such as diamond, silicon carbide, aluminum nitride, gallium nitride, and boron nitride. Wide bandwidth semiconductors offer the possible advantages of ultraviolet sensitivity, less dark charge, and less noise during room-temperature operation.

Hybrid Integration for Multimodal Detectors

One advantage of using an amplifier layer of an ultra-thin 2D material is that such a layer is highly transparent. As a consequence, a multimodal detector can be realized by hybrid integration, i.e., by stacking, of multiple absorbers that are sensitive to different optical wavelengths or different energies of energetic particles.

Figure 12:
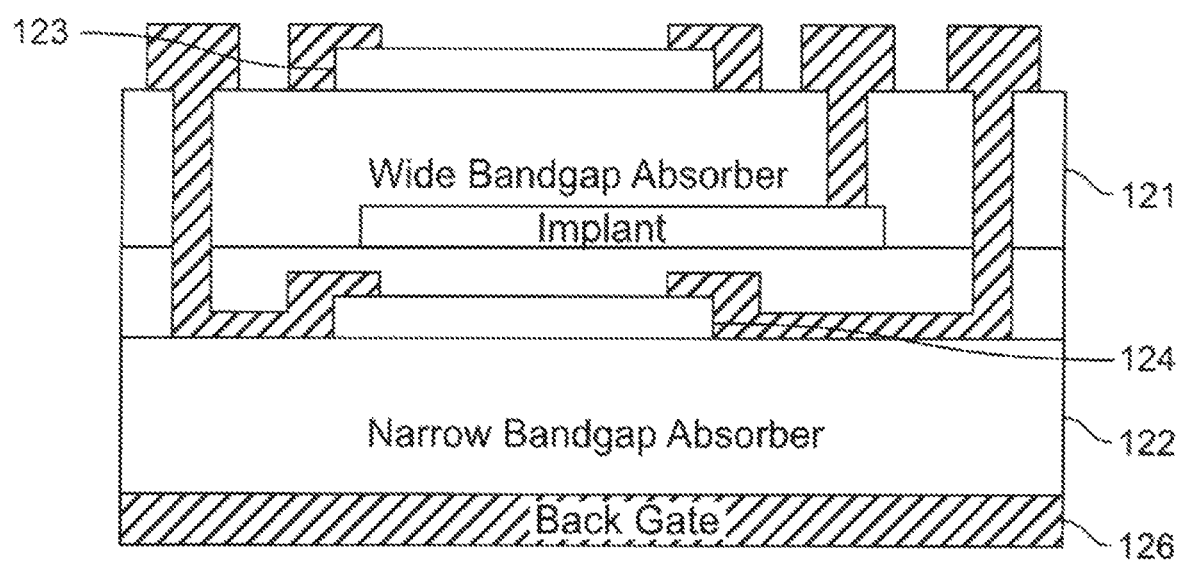
FIGS. 12 and 13 illustrate the concept of a stacked multimodal detector using $D^2GOS$ detector pixels.
Figure 13:
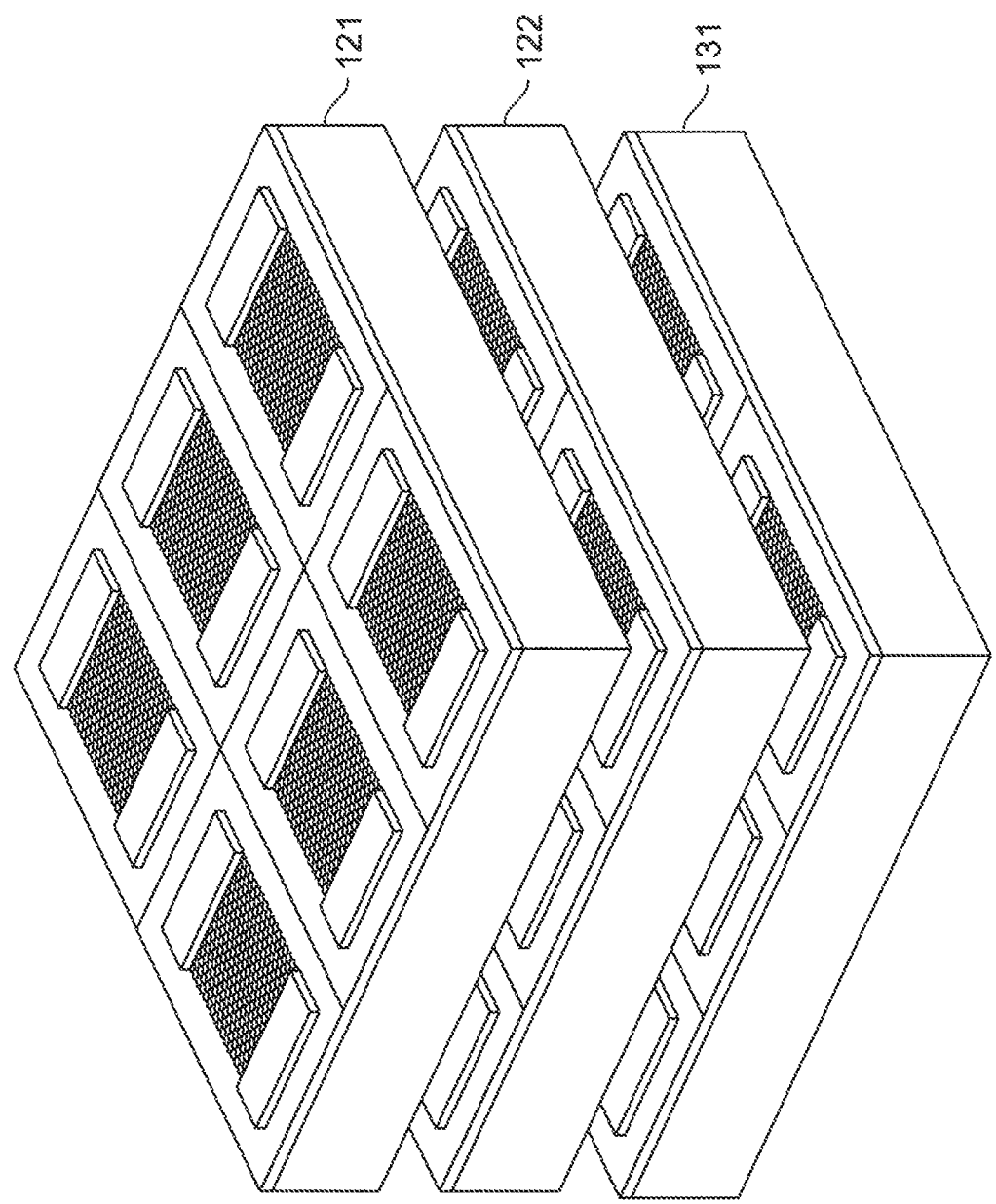

FIGS. 12 and 13 notionally illustrate one example implementing this concept. As shown in the figures, a detector layer composed of a wide-bandgap absorber 121 is stacked on top of a secondary detector layer that uses a narrower-bandgap absorber 122. The figures include 2D material 123, 2D material 124, and back gate 126. Photons with energies greater than the bandgap of the wide-bandgap absorber are absorbed in the first layer, where they generate detectable photo-induced charge. Photons with energies below the bandgap of the wide-bandgap material are not absorbed in that layer. Instead, they pass through the first layer and are absorbed in the secondary detector layer, where they generate detectable photo-induced charge. Additional layers 131, etc., can be added to the stack in analogous fashion.

We believe it would be feasible to design multimodal pixels by this approach that can simultaneously sense across the electromagnetic spectrum from the infrared to the ultraviolet regions.

Figure 14:
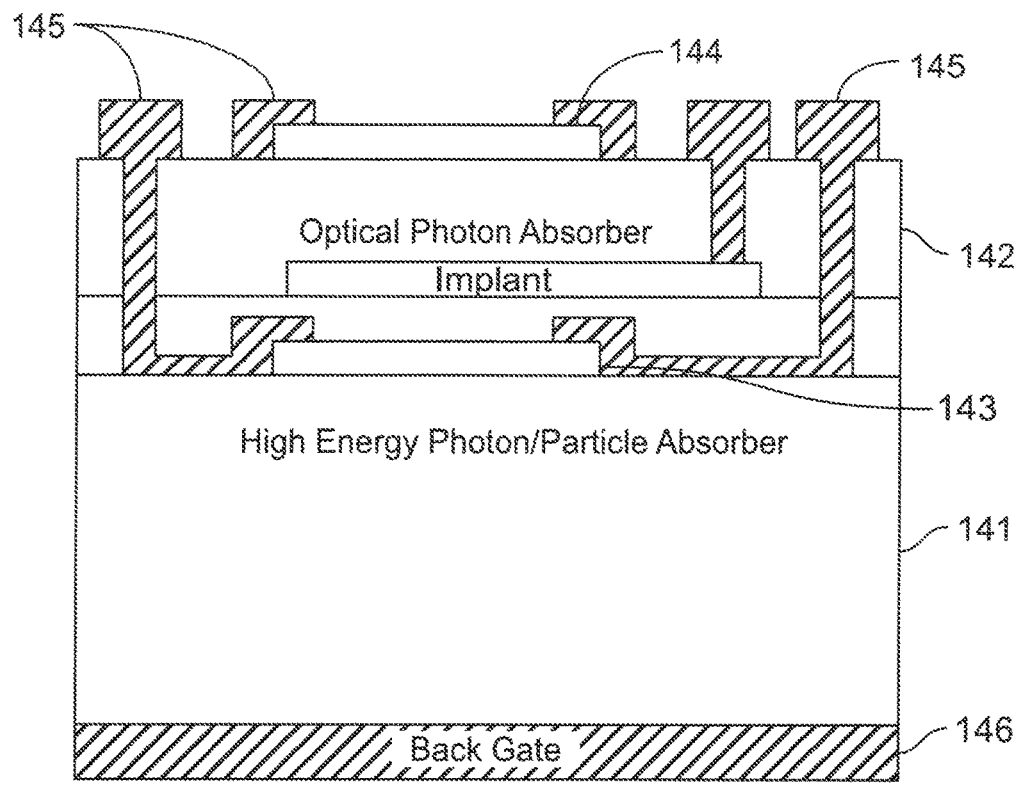
FIG. 14 is a notional diagram of a stacked multimodal pixel that combines optical detection with the detection of high-energy radiation.

A similar approach could also be used to make a detector that combines optical detection with radiation detection, i.e., the detection of energetic particles or x-rays or gamma rays. In that case, the secondary detector would be, for example, a semiconductor radiation detector composed of a radiation absorbing material such as cadmium zinc telluride (CZT). An example of such a detector is notionally illustrated in FIG. 14, where an absorber 141 for high-energy radiation is combined with an optical absorber 142. The figure also schematically shows graphene (or other two-dimensional material) layers 143, 144, electrical contacts 145, and back gate contact 146.

In fact, a secondary layer for radiation detection need not use semiconductor detectors. Instead, the pixels could be constituted by other types of ionization detectors, such as small-scale gaseous or liquid ionization detectors.

It should be noted in this regard that one problem encountered by optical detectors in contemporary use is the occurrence of false signals triggered by cosmic rays or other energetic background particles. A secondary detector layer that is sensitive only to energetic particles could be used to mitigate this problem. (An opaque screen, for example, could exclude optical excitation.) In the event of a coincidence, i.e., a simultaneous detection event by both the optical layer and the secondary layer, it would be inferred that the optical response is spurious and should be disregarded.

Figure 15:
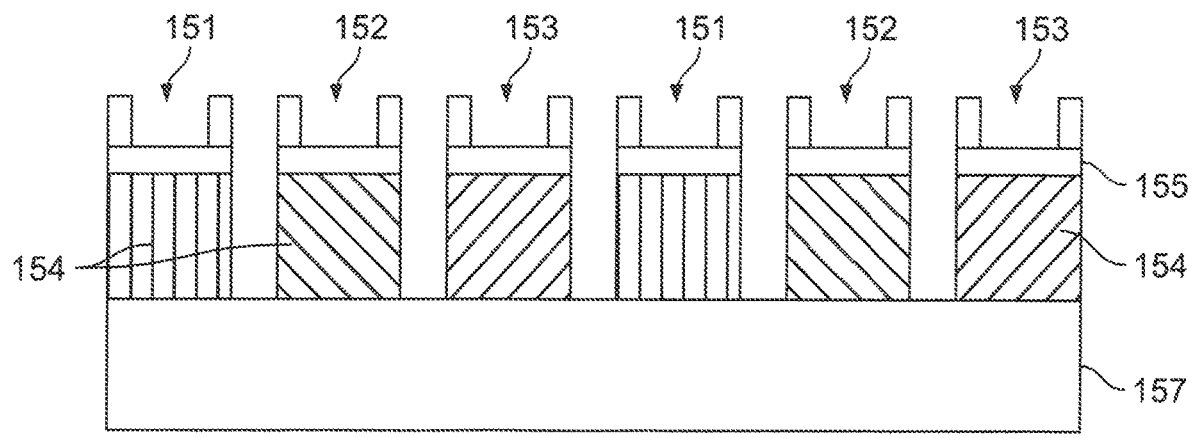
FIG. 15 notionally illustrates an alternative architecture for multimodal detection, in which pixels having absorbers with different bandgaps are clustered into super-pixels.

FIG. 15 notionally illustrates another architecture for multimodal detection. In the example of FIG. 15, a periodically repeating super-pixel is defined as a cluster of pixels 151, 152, 153 having absorbers 154 with different bandgaps, so that they are sensitive to different spectral bands. In the simplified view of FIG. 15, graphene layers 155, electrical contacts 156 to the graphene, and the backside contact 157 are also indicated.

System Operation

Figure 16:
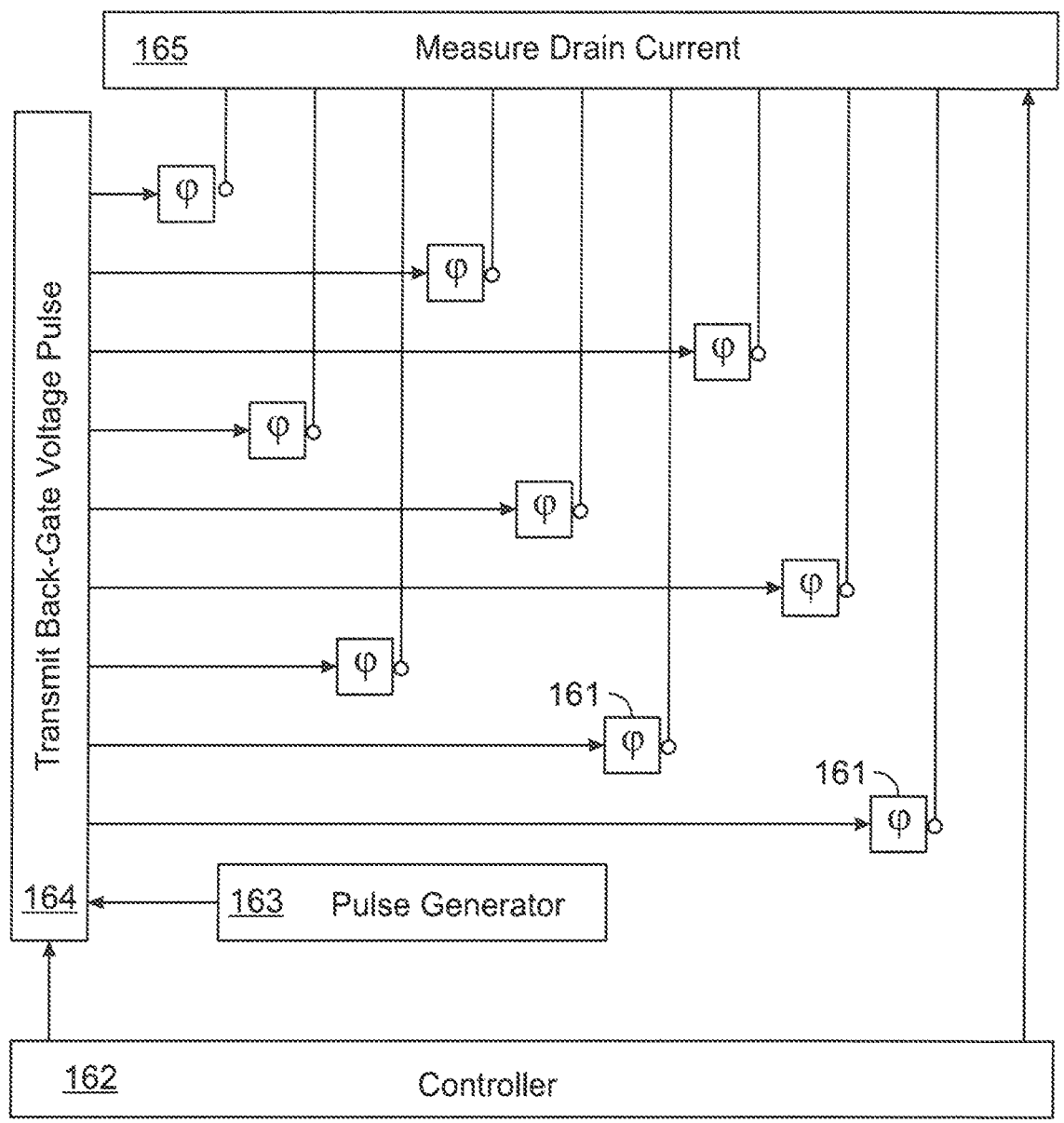
FIG. 16 is a notional block diagram of an example imaging system that uses D²GOS detector pixels.

FIG. 16 is a notional block diagram of an imaging system that uses pixels of the kind described above. It will be seen that the system includes multiple sensor devices 161 arranged in an array. For simplicity of presentation, the figure shows a 3×3 array. In practice, of course, much larger arrays will be typical. Extension to larger dimensions is straightforward.

The illustrated system also includes a controller 162, a pulse generator 163, a network 164 for transmitting the generated voltage pulses to the back-gate electrodes of the respective D²GOS devices, and a readout network 165 for accessing an indication of the drain current from each of the devices. The controller determines the pulse shape, pulse height, and pulse timing for the pulses going out to the D²GOS devices. In systems designed for random access, the controller may direct that pulses having different characteristics should go to different designated devices, and it may direct that pulses should go only to selected devices. Different sets of pulse characteristics may be selected, for example, from a stored library.

In operation, the voltage pulses applied to the back-gate electrodes drive the devices into deep depletion. The readout signals provide time-sampled or integrated measurements of the drain currents that flow during deep depletion. The various D²GOS devices may be collectively driven into deep depletion all at the same time, or they may be driven into deep depletion according to a sequential scheme.

Various distribution networks for transmitting the pulses are known in the art and need not be described here in detail. In the conceptually simplest arrangement, a dedicated line goes to the back-gate electrode of each respective device, and the respective pulses are sent sequentially or in a parallel scheme using multiple pulse generators. In alternative arrangements, time-division techniques are used to send the pulses to respective target devices over a bus network. Similar techniques may be used for random access by the readout network.

Although not explicitly shown in the figure, it will be understood that each D²GOS device has a source voltage terminal, that may, e.g., be at ground potential. It will also be understood that each device also has a drain voltage terminal; all of these terminals will typically be maintained at the same drain voltage. Measurement of the drain current may be performed, for example, by sampling the voltage drop across a measuring resistor in series with the drain voltage terminal.

Under control by a suitably configured controller, the time-dependent drain current may be sampled from all of the devices, or from designated devices, at selectable sampling times during the rising portion of the pulse waveform.

Figure 17:
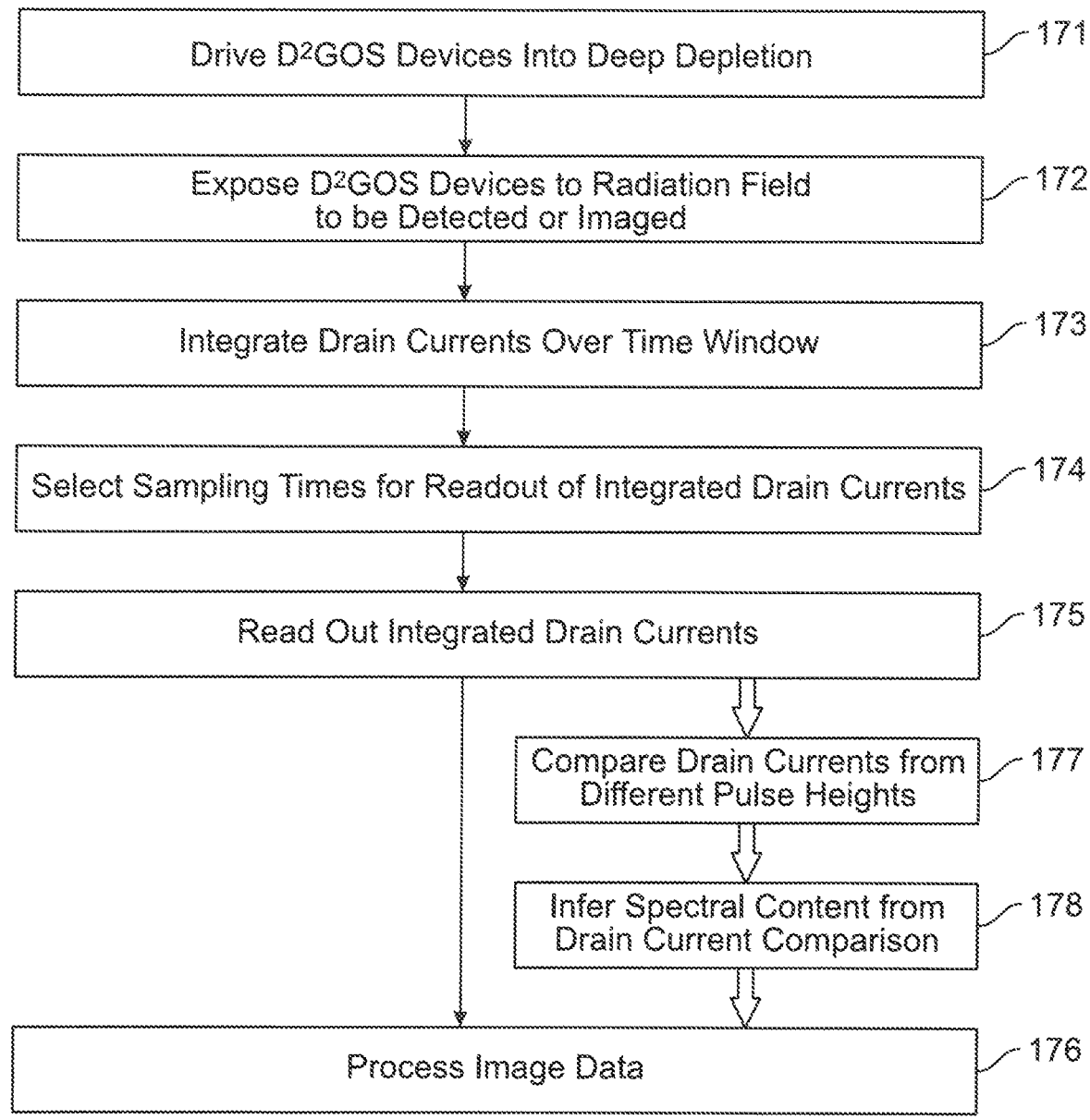
FIG. 17 is a flowchart illustrating an example process that can be carried out using the system of FIG. 16.

FIG. 17 is a flowchart illustrating one example process that can be carried out using the system of FIG. 16. As seen in the figure, back-gate voltage pulses are transmitted to the respective D²GOS devices to drive them 171 into deep depletion. While in deep depletion, the devices are subjected 172 to the electromagnetic field or high-energy radiation field that is to be detected or imaged. The photoexcited drain currents are integrated 173 over one or more time windows. (Typically, the integration will be performed by integrating a voltage signal indicative of the drain current.) Sampling times may be selected 174 for the readout 175 of the drain currents. The integrated drain currents are read out.

This readout may directly provide image data that can be processed 176 to provide an image. The image processing can take into account different spectral sensitivities of different pixels in order to provide, e.g., a color image or an image that correlates optical data with high-energy radiation data.

Alternatively, the readout may undergo further processing to provide the image data. In the example shown, pixels are doubly or multiply excited by pulses having different pulse heights, so that they produce different depletion depths. The resulting drain currents are compared 177, thereby producing data that are used to infer 178 spectral content of the exciting radiation.

We claim:

1. An imaging system, comprising:
a plurality of junction devices arranged in an array;
a controller; and
a control bus and a readout bus connected between the junction devices and the controller;
wherein:
each junction device comprises a semiconductor absorber body, a dielectric film of insulating oxide that overlies an interface region of the semiconductor absorber body, and a channel layer comprising graphene that overlies the dielectric film, whereby a graphene/oxide/semiconductor (GOS) junction is formed in the interface region of each junction device;
each junction device further comprises a metallic source electrode and a metallic drain electrode contacting opposing ends of the channel layer, and further comprises a metallic back-gate electrode contacting a side of the semiconductor absorber body opposite to the interface region;
within each junction device, the source and drain electrodes are connected to the channel layer so that when they are energized by an applied source-drain voltage, a source-drain current passes between them through the channel layer;
the controller is configured to provide source-drain voltages for the junction devices;
the controller is configured to provide, as back-gate voltages to be applied to the back-gate electrodes of the junction devices, voltage waveforms that rise in magnitude during a rising period of time at a rate sufficient to drive the interface regions of the respective junction devices into deep depletion;
the control bus is connected so as to deliver the source-drain voltages and back-gate voltages from the controller to the junction devices;
the controller is configured to receive readout signals, comprising signals indicating source-drain current, from the junction devices;
the readout bus is connected so as to deliver the readout signals from the junction devices to the controller; and
the controller is configured to sample the signal indicating source-drain current from each junction device during the rising periods of time of the back-gate voltage waveform applied to such device while its interface region is in deep depletion.

2. The imaging system of claim 1, wherein the controller is configured to drive all GOS junctions of the array of junction devices into deep depletion simultaneously.

3. The imaging system of claim 1, wherein the controller is configured to provide the source-drain voltages to individually selectable ones of the junction devices and to sample the readout signals indicating source-drain current from individually selectable ones of the junction devices.

4. The imaging system of claim 1, wherein:
each junction device has a respective wavelength range of spectral sensitivity due to optical absorption characteristics of its respective semiconductor absorber body;
the array of junction devices is organized into periodically repeating clusters;
each said cluster comprises two or more coplanar junction devices; and
the respective junction devices within each said cluster have different wavelength ranges of spectral sensitivity.

5. The imaging system of claim 1, wherein:
each junction device has a respective wavelength range of spectral sensitivity due to optical absorption characteristics of its respective semiconductor absorber body;
the array of junction devices has two lateral dimensions and a depth dimension;
in the depth dimension, junction devices are arranged one above the other to form vertically stacked groups of two or more junction devices; and
the respective junction devices within each vertically stacked group have different wavelength ranges of spectral sensitivity.

6. The imaging system of claim 1, wherein:
the imaging system includes ionization detectors; and
within the array of junction devices, each of at least some junction devices or clusters of junction devices is vertically stacked with an ionization detector.

7. The imaging system of claim 6, wherein the ionization detectors are semiconductor detectors.

8. A method for detecting radiant energy with at least a first junction device in which a dielectric film of insulating oxide overlies an interface region of a semiconductor absorber body and a channel layer comprising graphene overlies the dielectric film such that a graphene/oxide/semiconductor (GOS) junction is formed, comprising:
applying a time-varying back-gate voltage between the channel layer and a back-gate electrode that contacts a side of the semiconductor absorber body opposed to the interface region, wherein the time-varying back-gate voltage has a voltage waveform that rises in magnitude during a rising period of time at a rate sufficient to drive the interface region into deep depletion; and
at one or more sampling times within the rising period of time, while the interface region is in deep depletion, measuring a change in electrical resistance of the channel layer.

9. The method of claim 8, wherein the change in electrical resistance of the channel layer is an indication of integrated charge in the interface region.

10. The method of claim 8, performed in an imaging array in which the first junction device is one of a plurality of replicated junction devices.

11. The method of claim 10, wherein at least the first junction device is individually accessed for measuring the change in electrical resistance of its channel layer.

12. The method of claim 11, wherein the individual access is implemented, at least in part, by applying a source-drain voltage between the source electrode and the drain electrode of the individually accessed device.

13. The method of claim 10, wherein the respective interface regions of the plurality of replicated junction devices are driven into deep depletion collectively by application of the back-gate voltage to their respective back-gate electrodes.

14. The method of claim 10, wherein:
the measuring of a change in electrical resistance of a channel layer is performed on the first junction device and on at least a second junction device in the imaging array; and
each of the first and second junction devices has a different, respective wavelength range of spectral sensitivity.

15. The method of claim 10, wherein:
the imaging array further comprises an arrangement of ionization detectors; and
the method further comprises reading out indications of ionization charge or ionization current from the ionization detectors.

* * * * *